United States Patent
Xia et al.

(10) Patent No.: US 7,125,813 B2
(45) Date of Patent: *Oct. 24, 2006

(54) METHOD OF DEPOSITING LOW K BARRIER LAYERS

(75) Inventors: Li-Qun Xia, Santa Clara, CA (US); Ping Xu, Fremont, CA (US); Louis Yang, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/828,441

(22) Filed: Apr. 20, 2004

(65) Prior Publication Data

US 2004/0198070 A1    Oct. 7, 2004

Related U.S. Application Data

(63) Continuation of application No. 10/010,950, filed on Nov. 13, 2001, now Pat. No. 6,759,327.

(60) Provisional application No. 60/328,018, filed on Oct. 9, 2001.

(51) Int. Cl.
H01L 21/31    (2006.01)

(52) U.S. Cl. .............................. 438/778; 257/E21.274

(58) Field of Classification Search ................ 438/627, 438/643, 634, 931
See application file for complete search history.

(56) References Cited

U.S. PATENT DOCUMENTS

| | | | |
|---|---|---|---|
| 4,262,631 A | 4/1981 | Kubacki | |
| 4,532,150 A | 7/1985 | Endo et al. | |
| 4,634,601 A | 1/1987 | Hamakawa et al. | |
| 4,759,947 A | 7/1988 | Ishihara et al. | |
| 4,894,352 A | 1/1990 | Lane et al. | |
| 5,011,706 A | 4/1991 | Tarhay et al. | |
| 5,224,441 A | 7/1993 | Felts et al. | |
| 5,238,866 A | 8/1993 | Bolz et al. | |
| 5,242,530 A | 9/1993 | Batey et al. | |
| 5,465,680 A | 11/1995 | Loboda | |
| 5,494,712 A | 2/1996 | Hu et al. | |
| 5,554,570 A | 9/1996 | Maeda et al. | |
| 5,607,773 A | 3/1997 | Ahlburn et al. | |
| 5,638,251 A | 6/1997 | Goel et al. | |
| 5,710,067 A | 1/1998 | Foote et al. | |
| 5,711,987 A | 1/1998 | Bearinger et al. | |
| 5,730,792 A | 3/1998 | Camilletti et al. | |
| 5,776,235 A | 7/1998 | Camilletti et al. | |
| 5,780,163 A | 7/1998 | Camilletti et al. | |
| 5,818,071 A | 10/1998 | Loboda et al. | |
| 5,876,891 A | 3/1999 | Takimoto et al. | |
| 5,926,740 A | 7/1999 | Forbes et al. | |

(Continued)

FOREIGN PATENT DOCUMENTS

DE    41 26 759 A1    2/1993

(Continued)

OTHER PUBLICATIONS

PCT International Search Report for PCT/US2004/000374, dated Jun. 18, 2004 (AMAT/7653.PCT).

(Continued)

*Primary Examiner*—Alexander Ghyka
(74) *Attorney, Agent, or Firm*—Patterson and Sheridan (57) ABSTRACT

A method is provided for processing a substrate including providing a processing gas comprising an organosilicon compound comprising a phenyl group to the processing chamber, and reacting the processing gas to deposit a low k silicon carbide barrier layer useful as a barrier layer in damascene or dual damascene applications with low k dielectric materials.

5 Claims, 3 Drawing Sheets

U.S. PATENT DOCUMENTS

| | | | |
|---|---|---|---|
| 5,989,998 | A | 11/1999 | Sugahara et al. |
| 6,051,321 | A | 4/2000 | Lee et al. |
| 6,054,379 | A | 4/2000 | Yau et al. |
| 6,060,132 | A | 5/2000 | Lee |
| 6,068,884 | A | 5/2000 | Rose et al. |
| 6,072,227 | A | 6/2000 | Yau et al. |
| 6,140,226 | A | 10/2000 | Grill et al. |
| 6,147,009 | A | 11/2000 | Grill et al. |
| 6,159,871 | A | 12/2000 | Loboda et al. |
| 6,242,339 | B1 | 6/2001 | Aoi |
| 6,287,900 | B1 | 9/2001 | Yamazaki et al. |
| 6,303,523 | B1 | 10/2001 | Cheung et al. |
| 6,312,793 | B1 | 11/2001 | Grill et al. |
| 6,340,435 | B1 | 1/2002 | Bjorkman et al. |
| 6,348,725 | B1 | 2/2002 | Cheung et al. |
| 6,352,945 | B1 | 3/2002 | Matsuki et al. |
| 6,365,527 | B1 | 4/2002 | Yang et al. |
| 6,383,955 | B1 | 5/2002 | Matsuki et al. |
| 6,410,463 | B1 | 6/2002 | Matsuki |
| 6,413,583 | B1 | 7/2002 | Moghadam et al. |
| 6,432,846 | B1 | 8/2002 | Matsuki |
| 6,436,824 | B1 | 8/2002 | Chooi et al. |
| 6,455,445 | B1 | 9/2002 | Matsuki et al. |
| 6,465,366 | B1 | 10/2002 | Nemani et al. |
| 6,500,773 | B1 | 12/2002 | Gaillard et al. |
| 6,511,903 | B1 | 1/2003 | Yau et al. |
| 6,511,909 | B1 | 1/2003 | Yau et al. |
| 6,528,426 | B1 * | 3/2003 | Olsen et al. ............ 438/689 |
| 6,537,929 | B1 | 3/2003 | Cheung et al. |
| 6,541,282 | B1 | 4/2003 | Cheung et al. |
| 6,555,476 | B1 | 4/2003 | Olsen et al. |
| 6,562,690 | B1 | 5/2003 | Cheung et al. |
| 6,573,196 | B1 | 6/2003 | Gaillard et al. |
| 6,593,247 | B1 | 7/2003 | Huang et al. |
| 6,596,655 | B1 | 7/2003 | Cheung et al. |
| 6,627,532 | B1 | 9/2003 | Gaillard et al. |
| 6,660,656 | B1 | 12/2003 | Cheung et al. |
| 6,660,663 | B1 | 12/2003 | Cheung et al. |
| 2002/0000670 | A1 | 1/2002 | Yau et al. |
| 2002/0093075 | A1 | 7/2002 | Gates et al. |
| 2002/0111042 | A1 | 8/2002 | Yau et al. |
| 2002/0155386 | A1 | 10/2002 | Xu et al. |
| 2002/0160626 | A1 | 10/2002 | Matsuki et al. |
| 2002/0172766 | A1 | 11/2002 | Laxman et al. |
| 2003/0001282 | A1 | 1/2003 | Meynen et al. |
| 2003/0003765 | A1 | 1/2003 | Gibson, Jr. et al. |
| 2003/0068881 | A1 | 4/2003 | Xia et al. |
| 2003/0085408 | A1 | 5/2003 | Yang et al. |
| 2003/0089988 | A1 | 5/2003 | Matsuura |
| 2003/0111730 | A1 | 6/2003 | Takeda et al. |
| 2003/0129827 | A1 | 7/2003 | Lee et al. |
| 2003/0139035 | A1 | 7/2003 | Yim et al. |
| 2005/0038276 | A1 | 2/2005 | Laxman et al. |

FOREIGN PATENT DOCUMENTS

| | | |
|---|---|---|
| DE | 199 04 311 A1 | 8/1999 |
| EP | 0 613 178 A2 | 8/1994 |
| EP | 0 935 283 A2 | 8/1999 |
| EP | 1050601 A1 * | 8/2000 |
| EP | 1 107 303 A2 | 6/2001 |
| EP | 1 122 770 A2 | 8/2001 |
| EP | 1 176 226 A1 | 1/2002 |
| JP | 09-008031 | 1/1997 |
| WO | WO 99/41423 A2 | 8/1999 |
| WO | WO 00/19498 A1 | 4/2000 |
| WO | WO 00/20900 A3 | 4/2000 |

OTHER PUBLICATIONS

Takashi Nakamura, "Synthesis of Amorphous Films from Phenylsilanes by Plasma Chemical Vapor Deposition" Makromol. Chem. 189, pp. 1315-1322 (1988).

V. Cech, et al. "Thin Plasma-Polymerized Films of Dichloro(Methyl)Phenylsilane" Czechoslovak Journal of Physics, vol. 50 (2000), Suppl. S3 pp. 356-364.

PCT International Search Report for PCT US02/36229, dated Sep. 3, 2003 (AMAT/6392.PC).

Written Opinion for PCT US99/22424, dated Apr. 5, 2001 (AMAT/2966.03.PC).

PCT International Serach Report for PCT US99/22425, dated Feb. 11, 2000. (AMAT/2966.01.PC).

PCT International Search Report for PCT US02/40034, dated May 19, 2003. (AMAT/6084.PC).

Dijkstra, et al. "Optimization of Anti-Reflection Layers for Deep UV Lithography", Proceedings of SPIE Optical/Laser Microlithography, Bellingham, SPIE, vol. 1674, (1992) pp. 362-375.

Omar, M.A. "Elementary Solid State Physics: Principles and Applications,", Addison-Wesley Publishing Co. (1975) pp. 124-125.

Fukuda, et al. "Highly Reliable SiOF Film Formation by ECR-CVD Using $SiF_2H_2$", Symposium on VLSI Technology Digest of Technical Papers IEEE (1996) pp. 114-115.

Wu, et al. "Advanced Metal Barrier Fee CU Damascene Interconnects with PECVD Silicon Carbide Barriers for 90/65-nm BEOL Technology", 2002 IEE pp. 595-598.

U.S. Appl. No. 09/270,039, filed on Mar. 16, 1999. (AMAT/2966.X3).

PCT International Preliminary Report on Patentability dated Jul 28, 2005 for PCT/US04/000374. (APPM/007653PC).

PCT Written Opinion of the International Searching Authority dated Jul. 28, 2005 for PCT/US04/000374. (APPM/007653PC).

* cited by examiner

METHOD OF DEPOSITING LOW K BARRIER LAYERS

CROSS-REFERENCE TO RELATED APPLICATIONS

This application is a continuation of U.S. patent application Ser. No. 10/010,950, filed on Nov. 13, 2001 now U.S. Pat. No. 6,759,327, that claims benefit of U.S. provisional patent application Ser. No. 60/328,018, filed Oct. 9, 2001, both of which are herein incorporated by reference.

BACKGROUND OF THE DISCLOSURE

1. Field of the Invention

The invention relates to the fabrication of integrated circuits, more specifically to a process for depositing dielectric layers on a substrate, and to the structures formed by the dielectric layer.

2. Description of the Related Art

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 µm and even 0.18 µm feature sizes, and tomorrow's plants soon will be producing devices having even smaller geometries.

To further reduce the size of devices on integrated circuits, it has become necessary to use conductive materials having low resistivity and to use insulators having low dielectric constants (dielectric constants of less than 4.0) to also reduce the capacitive coupling between adjacent metal lines. One such low k material is silicon oxycarbide deposited by a chemical vapor deposition process and silicon carbide, both of which may be used as dielectric materials in fabricating damascene features.

One conductive material having a low resistivity is copper and its alloys, which have become the materials of choice for sub-quarter-micron interconnect technology because copper has a lower resistivity than aluminum, (1.7 µΩ-cm compared to 3.1 µΩ-cm for aluminum), a higher current and higher carrying capacity. These characteristics are important for supporting the higher current densities experienced at high levels of integration and increased device speed. Further, copper has a good thermal conductivity and is available in a highly pure state.

One difficulty in using copper in semiconductor devices is that copper is difficult to etch and achieve a precise pattern. Etching with copper using traditional deposition/etch processes for forming interconnects has been less than satisfactory. Therefore, new methods of manufacturing -interconnects having copper containing materials and low k dielectric materials are being developed.

One method for forming vertical and horizontal interconnects is by a damascene or dual damascene method. In the damascene method, one or more dielectric materials, such as the low k dielectric materials, are deposited and pattern etched to form the vertical interconnects, e.g., vias, and horizontal interconnects, e.g., lines. Conductive materials, such as copper containing materials, and other materials, such as barrier layer materials used to prevent diffusion of copper containing materials into the surrounding low k dielectric, are then inlaid into the etched pattern. Any excess copper containing materials and excess barrier layer material external to the etched pattern, such as on the field of the substrate, is then removed.

However, low k dielectric materials are often porous and susceptible to interlayer diffusion of conductive materials, such as copper, which can result in the formation of short-circuits and device failure. A dielectric barrier layer material is often disposed between the copper material and surrounding the low k material to prevent interlayer diffusion. However, traditional dielectric barrier layer materials, such as silicon nitride, often have high dielectric constants of 7 or greater. The combination of such a high k dielectric material with surrounding low k dielectric materials results in dielectric stacks having a higher than desired dielectric constant.

Therefore, there remains a need for an improved process for depositing dielectric barrier layer materials with low dielectric constants for damascene applications.

SUMMARY OF THE INVENTION

Aspects of the invention generally provide a method for depositing a barrier layer material having a low dielectric constant. In one aspect, the invention provides a method for processing a substrate including depositing a barrier layer on the substrate by introducing a processing gas comprising an organosilicon compound into a processing chamber, wherein the organosilicon compound has the formula $SiH_a(CH_3)_b(C_6H_5)_c$, wherein a is 0 to 3, b is 0 to 3, and c is 1 to 4, and reacting the processing gas to deposit the barrier layer, wherein the barrier layer has a dielectric constant less than 4 and depositing a first dielectric layer adjacent the barrier layer, wherein the dielectric layer comprises silicon, oxygen, and carbon and has a dielectric constant of about 3 or less.

In another aspect, a method is provided for processing a substrate including depositing a barrier layer on the substrate by introducing a processing gas comprising an organosilicon compound into a processing chamber, wherein the organosilicon compound has the formula $SiH_a(CH_3)_b(C_6H_5)_c$, wherein a is 1 or 2, b is 1 or 2, and c is 1 or 2, and reacting the processing gas to deposit the barrier layer, wherein the barrier layer has a dielectric constant of less than 4 and depositing a dielectric layer adjacent the barrier layer, wherein the dielectric layer has a dielectric constant less than 4.

BRIEF DESCRIPTION OF THE DRAWINGS

So that the manner in which the above aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

For a further understanding of aspect of the invention, reference should be made to the ensuing detailed description.

DETAILED DESCRIPTION OF THE PREFERRED EMBODIMENTS

Aspects of the invention described herein refer to methods and precursors for depositing a silicon carbide barrier layer having a low dielectric constant. The silicon carbide barrier layer may also include hydrogen and may be doped with oxygen, nitrogen, boron, phosphorus, or combinations thereof, to improve film properties. Doped silicon carbide generally includes less than about 15 atomic percent (atomic %) or less of a dopant, such as oxygen, nitrogen, boron, phosphorus, or combinations thereof.

The silicon carbide barrier layer is deposited by reacting a processing gas including an organosilicon compound having the formula $SiH_a(CH_3)_b(C_6H_5)_c$, wherein a is 0 to 3, b is 0 to 3, and c is 1 to 4, in a plasma to form a dielectric layer comprising carbon-silicon bonds and a dielectric constant less than 4, preferably less than about 3.5. A dopant-containing material, such as oxygen ($O_2$) or siloxane compound for oxygen doping, or borane ($BH_3$) for boron doping, may also be present during the deposition process.

It was unexpectedly and surprising discovered by the inventors herein that depositing silicon carbide materials with an organosilicon compound having the formula $SiH_a(CH_3)_b(C_6H_5)_c$, wherein a is 0 to 3, b is 0 to 3, and c is 1 to 4, under the processing parameters described herein, produced a silicon carbide film having a dielectric constant of less than 4 with improved barrier layer properties, such as an interlayer diffusion resistance of about 100% greater than silicon carbide film produced by commercially available alkylsilane precursors, such as trimethylsilane (TMS). This is unexpected because it has been observed that phenyl groups increase the porosity of the deposited dielectric material, thereby reducing the interlayer diffusion resistance of the deposited dielectric material. The barrier layers are preferably deposited adjacent dielectric layers comprising silicon, oxygen, and carbon, which have a dielectric layer of less than about 3.

The organosilicon compounds used for barrier layer materials generally include the structure:

wherein R is a phenyl group. The organosilicon compound includes the formula $SiH_a(CH_3)_b(C_6H_5)_c$, wherein a is 0 to 3, b is 0 to 3, and c is 1 to 4, and a+b+c is equal to 4. Examples of suitable precursors derived from this formula include diphenylsilane, dimethylphenylsilane, diphenylmethylsilane, phenylmethylsilane, and combinations thereof. Preferably, b is 1 to 3 and c is 1 to 3. The most Preferred organosilicon compounds for deposition as barrier layer materials include organosilicon compounds having the formula $SiH_a(CH_3)_b(C_6H_5)_c$, wherein a is 1 or 2, b is 1 or 2, and c is 1 or 2. Examples of preferred precursors include dimethylphenylsilane and diphenylmethylsilane. The processing gas may also include an inert gas, such as argon (Ar), helium (He), neon (Ne), xenon (Xe), nitrogen ($N_2$), and combinations thereof.

The processing gas may further include compounds having Si—O—Si bonding groups, such as organosiloxane compounds, compounds having Si—N—Si bonding groups, such as silazane compounds, and combinations thereof, for doping the deposited silicon carbide material with oxygen and nitrogen respectively. Alkylsilane precursors, such as trimethylsilane (TMS), may also be used with the organosilicon precursors described herein to modify or change desired film properties.

Precursors with siloxane bonds provide silicon carbide films with bonded oxygen that can reduce the dielectric constant of the film as well as reduce the current leakage of the film. Examples of suitable siloxane precursors include cyclic compounds, for example, 1,3,5,7-tetramethylcyclotetrasiloxane (TMCTS) or octamethylcyclotetrasiloxane (OMCTS), and aliphatic compounds, such as 1,1,3,3-tetramethyldisiloxane (TMDSO).

Compounds having bonded nitrogen, such as in the silazane compounds, can improve the hardness of films as well as reduced the current leakage of the films. Examples of suitable silizane precursors includes aliphatic compounds, such as hexamethyldisilazane and divinyltetramethyldisilizane, as well as cyclic compounds, such as hexamethylcyclotrisilazane.

The barrier layer may further be doped with oxygen, nitrogen, boron, or phosphorous to reduce the dielectric constant of the deposited material. A ratio of dopant to organosilicon compound in the processing gas is between about 1:5 or greater, such as between about 1:5 and about 1:100. Phosphorus and/or boron doping of the low k silicon carbide layer may be performed by introducing phosphine ($PH_3$) or borane ($BH_3$), or borane derivative thereof, such as diborane ($B_2H_6$), into the chamber during the deposition process.

Oxygen doping may occur by optionally including an oxygen-containing gas, for example, oxygen ($O_2$), ozone ($O_3$), nitrous oxide ($N_2O$), carbon monoxide (CO), carbon dioxide ($CO_2$), or combinations thereof. A silioxane compound may also be used with the processing gas for oxygen doping of the deposited material. Nitrogen doping may occur by optionally including a nitrogen-containing gas, for example, ammonia ($NH_3$), nitrogen ($N_2$), a silizane compound, or combinations thereof.

A silicon carbide barrier layer may be deposited in one embodiment by supplying an organosilicon compound, such as diphenylsilane, to a plasma processing chamber at a flow rate between about 10 milligrams/minute (mgm) and about 1500 mgm, optionally supplying a dopant at a flow rate between about 10 sccm and about 2000 sccm, supplying an inert gas at a flow rate between about 1 sccm and about 10000 sccm, maintaining a substrate temperature between about 0° C. and about 500° C., maintaining a chamber pressure below about 500 Torr and an RF power of between about 0.03 watts/cm² and about 1500 watts/cm².

The RF power can be provided at a high frequency such as between 13 MHz and 14 MHz. The RF power can be provided continuously or in short duration cycles wherein the power is on at the stated levels for cycles less than about 200 Hz and the on cycles total between about 10% and about 30% of the total duty cycle. The processing gas may be introduced into the chamber by a gas distributor, the gas distributor may be positioned between about 200 mils and about 700 mils from the substrate surface. The gas distributor may be positioned between about 300 mils and about 600 mils during the deposition process.

A suitable reactor for performing the processes described herein is a DxZ™ chemical vapor deposition chamber commercially available from Applied Materials, Inc., Santa Clara, Calif. An example of a CVD reactor that may be used with the processes herein is described in U.S. Pat. No. 5,000,113, entitled A Thermal CVD/PECVD Reactor and Use for Thermal Chemical Vapor Deposition of Silicon Dioxide and In-situ Multi-step Planarized Process, issued to Wang et al. and assigned to Applied Materials, Inc., the assignee of the present invention.

The above process parameters provide a deposition rate for the silicon carbide layer in the range of about 500 Å/min to about 20,000 Å/min, such as a range between about 100 Å/min and about 3000 Å/min, when implemented on a 200 mm (millimeter) substrate in a deposition chamber available from Applied Materials, Inc., Santa Clara, Calif.

An example of a preferred silicon carbide barrier layer deposition process includes introducing dimethylphenylsilane at about 500 mg/min into the processing chamber, introducing helium at about 1000 sccm into the processing chamber, generating a plasma in the processing chamber by applying 200 watts of RF energy, maintaining the substrate temperature at about 350° C., maintaining the chamber pressure at about 6 Torr to deposit a silicon carbide layer. The spacing between the gas distributor and the substrate surface was 450 mil. A silicon carbide layer is deposited at about 1500 Å/min by this process. The deposited silicon carbide layer exhibited a dielectric constant of about 3.4.

Following deposition, the deposited dielectric material may be annealed at a temperature between about 100° C. and about 400° C. for between about 1 minute and about 60 minutes, preferably at about 30 minutes, to reduce the moisture content and increase the solidity and hardness of the dielectric material, if desired. The anneal is preferably performed after the deposition of the next layer which prevents shrinkage or deformation of the dielectric layer. Inert gases, such as argon and helium, may be added to the annealing atmosphere.

The deposited silicon carbide layer may be plasma treated to remove contaminants or other wise clean the exposed surface of the silicon carbide layer prior to subsequent deposition of materials thereon. The plasma treatment may be performed in the same chamber used to deposit the silicon and carbon containing material. The plasma treatment is also believed to improve film stability by forming a protective layer of a higher density material than the untreated silicon carbide material. The higher density silicon carbide material is believed to be more resistive to chemical reactions, such as forming oxides when exposed to oxygen, than the untreated silicon carbide material.

The plasma treatment generally includes providing an inert gas including helium, argon, neon, xenon, krypton, or combinations thereof, of which helium is preferred, and/or a reducing gas including hydrogen, ammonia, and combinations thereof, to a processing chamber. The inert gas or reducing gas is introduced into the processing chamber at a flow rate between about 500 sccm and about 3000 sccm, and generating a plasma in the processing chamber.

The plasma may be generated using a power density ranging between about 0.03 W/cm$^2$ and about 3.2 W/cm$^2$, which is a RF power level of between about 10 W and about 1000 W for a 200 mm substrate. Preferably, at a power level of about 100 watts for a silicon carbide material on a 200 mm substrate. The RF power can be provided at a high frequency such as between 13 MHz and 14 MHz. The RF power can be provided continuously or in short duration cycles wherein the power is on at the stated levels for cycles less than about 200 Hz and the on cycles total between about 10% and about 30% of the total duty cycle.

The processing chamber is preferably maintained at a chamber pressure of between about 1 Torr and about 12 Torr, for example about 3 Torr. The substrate is preferably maintained at a temperature between about 200° C. and about 450° C. during the plasma treatment. A substrate temperature of about the same temperature of the silicon carbide deposition process, for example about 290° C., may be used during the plasma treatment. The plasma treatment may be performed between about 10 seconds and about 100 seconds, with a plasma treatment between about 40 seconds and about 60 seconds preferably used. The processing gas may be introduced into the chamber by a gas distributor, the gas distributor may be positioned between about 200 mils and about 500 mils from the substrate surface. The gas distributor may be positioned between about 300 mils and about 600 mils during the plasma treatment.

However, it should be noted that the respective parameters may be modified to perform the plasma processes in various chambers and for different substrate sizes, such as 300 mm substrates. An example of a plasma treatment for a silicon and carbon containing film is further disclosed in U.S. patent application Ser. No. 09/336,525, entitled, "Plasma treatment to Enhance adhesion and to Minimize Oxidation of Carbon-Containing Layers," filed on Jun. 18, 1999, which is incorporated herein by reference to the extent not inconsistent with the disclosure and claimed aspects of the invention described herein.

The barrier layers are preferably deposited adjacent dielectric layers comprising silicon, oxygen, and carbon, a dielectric constant of less than about 3. The adjacent dielectric layers for use with the barrier layer material described herein have a carbon content of about 1 atomic percent excluding hydrogen atoms, preferably between about 5 and about 30 atomic percent excluding hydrogen atoms. The adjacent dielectric layer may be deposited by oxidizing an organosiliane compound in a plasma enhanced chemical vapor deposition technique. For example, a suitable adjacent dielectric material may be deposited by reacting trimethylsilane and oxygen in a plasma enhanced chemical vapor deposition technique, with the plasma formed under conditions including a high frequency RF power density from about 0.16 W/cm$^2$ to about 0.48 W/cm$^2$.

Examples of methods and uses for the adjacent dielectric layers comprising silicon, oxygen, and carbon, having a dielectric constant of less than about 3 are more further described in U.S. Pat. No. 6,054,379, issued May 25, 2000, U.S. Pat. No. 6,287,990, issued Sep. 11, 2001, and U.S. Pat. No. 6,303,523, issued on Oct. 16, 2001, which are incorporated by reference herein to the extent not inconsistent with the disclosure and claims described herein.

The embodiments described herein for depositing silicon carbide layers adjacent low k dielectric layers are provided to illustrate the invention, the particular embodiment shown should not be used to limit the scope of the invention.

Deposition of a Barrier Layer for a Dual Damascene Structure

Figure 1:
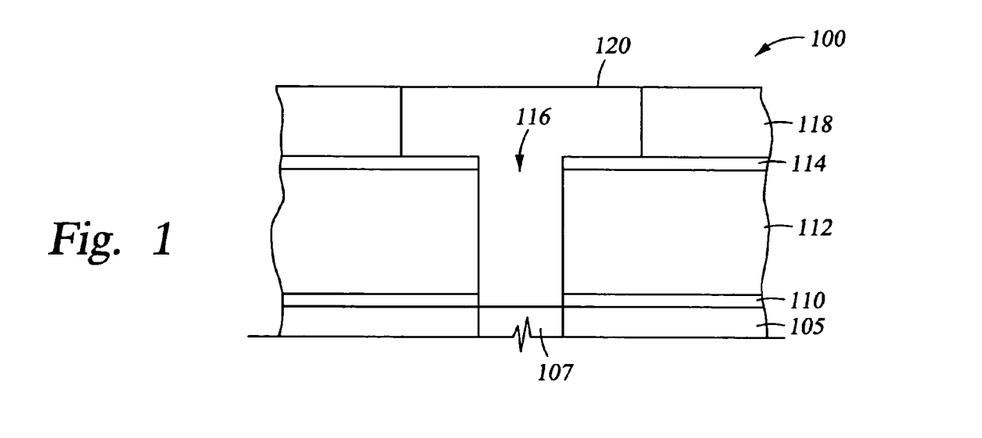
FIG. 1 is a cross sectional view showing a dual damascene structure comprising a low k barrier layer and a low k dielectric layer described herein.

An example of a damascene structure that is formed using the silicon carbide material described herein as a barrier layer is shown in FIG. 1. A silicon carbide barrier layer 110 is generally deposited using the precursors according to the processes described herein on the substrate surface to eliminate inter-level diffusion between the substrate and subsequently deposited material. The substrate surface may comprise metal features 107 formed in a dielectric material 105.

A first dielectric layer 112, comprising silicon, oxygen, and carbon, as described herein is deposited on the silicon carbide barrier layer 110 on the substrate surface including metal features 107 formed in a dielectric material 105. An etch stop (or second barrier layer) 114 of a silicon carbide material or oxidized organo silane layer is then deposited on the first dielectric layer 112. The etch stop 114 may include a silicon carbide material deposited from the organosilicon precursors described herein or an oxidized organo silane layer. Alternatively, the etch stop 114 may be a nitrogen containing silicon carbide material. The etch stop 114 is then pattern etched to define the openings of the interconnects or contacts/vias 116.

A second dielectric layer 118 is then deposited over the patterned etch stop. A photoresist is then deposited and patterned by conventional means known in the art to define the contacts/via 116. A single etch process is then performed to define the contact/vias 116 down to the etch stop and to etch the unprotected dielectric exposed by the patterned etch stop to define the contacts/vias 116. One or more conductive materials 120 such as copper are then deposited to fill the formed contacts/vias 116.

A preferred dual damascene structure fabricated in accordance with the invention including a silicon carbide barrier layer deposited by the processes described herein is sequentially depicted schematically in FIGS. 2A–2H, which are cross sectional views of a substrate having the steps of the invention formed thereon.

Figure 2A:
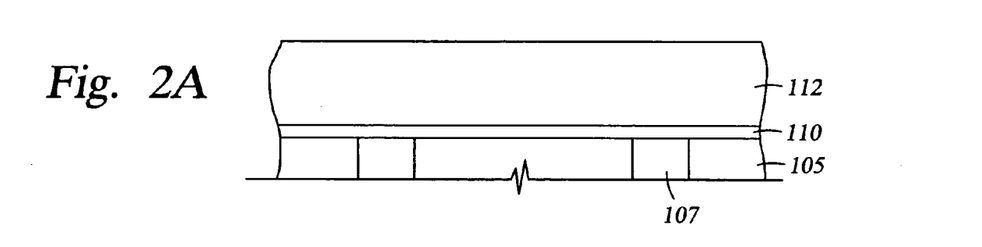
FIGS. 2A–2H are cross sectional views showing one embodiment of a dual damascene deposition sequence of the invention.

As shown in FIG. 2A, a silicon carbide barrier layer 110 is deposited on the substrate surface from the organosilicon precursors described herein. The silicon carbide barrier layer 110 may be doped with oxygen, boron, phosphorus, or combinations thereof. The silicon carbide barrier layer 110 may be deposited by introducing diphenylsilane at about 500 mg/min into the processing chamber, introducing helium at about 500 sccm into the processing chamber, generating a plasma in the processing chamber by applying 100 watts of RF energy, maintaining the substrate temperature at about 290° C., maintaining the chamber pressure at about 3 Torr to deposit a silicon carbide layer. The silicon carbide material is deposited at about 1500 Å/min by this process. The deposited silicon carbide layer has a dielectric constant of about 3.4.

While not shown, a capping layer of nitrogen free silicon carbide may be deposited on the barrier layer 110. The nitrogen free silicon carbide capping layer may be deposited in situ by the nitrogen doped silicon carbide process with the source of nitrogen minimized or eliminated during the deposition process.

The silicon carbide barrier layer 110 may be plasma treated with an inert gas including helium (He), argon (Ar), neon (Ne), and combinations thereof, and/or a reducing gas including hydrogen, ammonia, and combinations thereof. The plasma treatment may be performed in situ with the deposition of the silicon carbide material. Such a plasma treatment is believed to clean contaminants from the exposed surface of the silicon carbide material and may be used to stabilize the layer, such that it becomes less reactive with moisture and/or oxygen under atmospheric condition as well as the adhesion of layers formed thereover.

The plasma process includes a processing gas of helium or a reducing gas, such as hydrogen, at a power level of between about 200 watts and about 800 watts for between about 5 seconds and about 60 seconds for a 200 millimeter substrate. The processing chamber is maintained at a pressure of about 8.7 Torr or less and at a substrate temperature of about the deposition temperature of the layer, for example about 350° C. for dimethylphenylsilane, during the reactive clean process.

The first dielectric layer 112 of interlayer dielectric material is deposited on the first silicon carbide barrier layer 110 by oxidizing an organosilane or organosiloxane, such as trimethylsilane, to a thickness of about 5,000 to about 15,000 Å, depending on the size of the structure to be fabricated. An example of a low dielectric constant material that may be used as an interlayer dielectric material is Black Diamond™ commercially available from Applied Materials, Inc., of Santa Clara, Calif. Alternatively, the first dielectric layer may also comprise other low k dielectric material such as a low k polymer material including paralyne or a low k spin-on glass such as un-doped silicon glass (USG) or fluorine-doped silicon glass (FSG).

The first dielectric layer 112 may then be treated by a plasma process including helium or a reducing gas, such as hydrogen, at a power level of between about 200 watts and about 800 watts for between about 5 seconds and about 60 seconds for a 200 millimeter substrate. The processing chamber is maintained at a pressure and at a substrate temperature of about the deposition pressure and temperature of the first dielectric layer 112 during the reactive clean process.

Figure 2B:
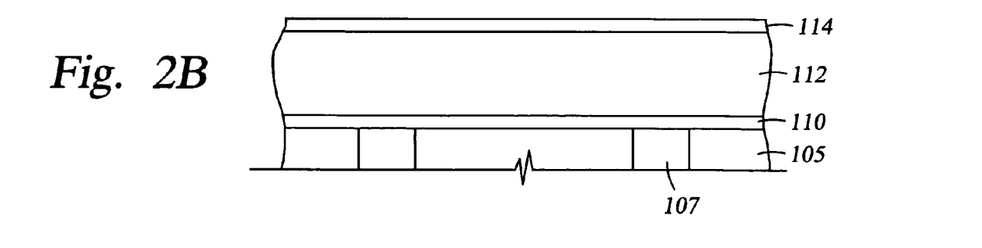
Figure 2C:
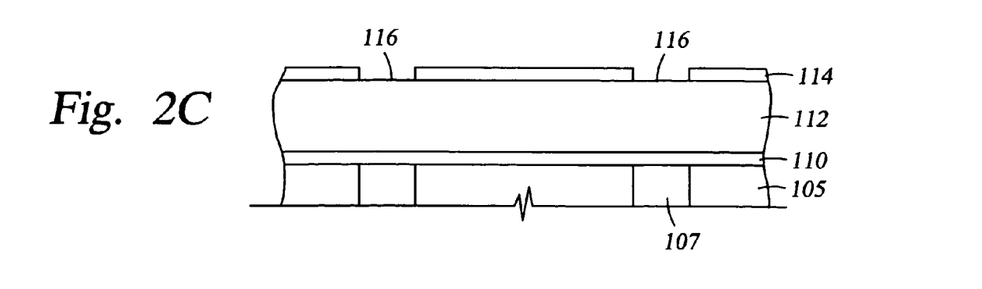

As shown in FIG. 2B, the low k etch stop 114, which may be a silicon carbide material, is then deposited on the first dielectric layer to a thickness of about 200 to about 1000 Å. The low k etch stop 114 may be deposited from the same precursors and by the same process as the silicon carbide barrier layer 110. The low k etch stop 114 may be plasma treated as described herein for the silicon carbide barrier layer 110. The low k etch stop 114 is then pattern etched to define the contact/via openings 116 and to expose first dielectric layer 112 in the areas where the contacts/vias are to be formed as shown in FIG. 2C. Preferably, the low k etch stop 114 is pattern etched using conventional photolithography and etch processes using fluorine, carbon, and oxygen ions. While not shown, a nitrogen-free silicon carbide or silicon oxide cap layer between about 100 Å and about 500 Å thick may be deposited on the etch stop 116 prior to depositing further materials.

Figure 2D:
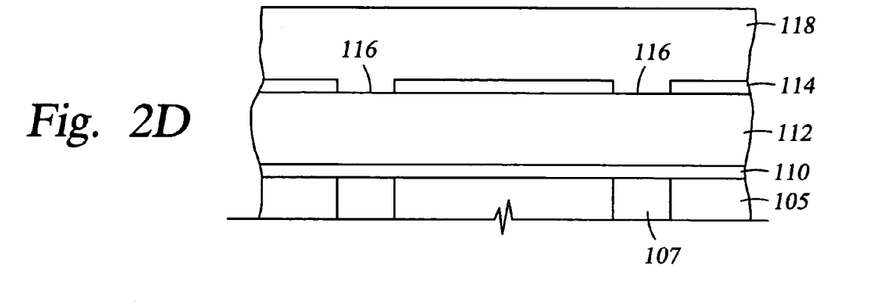

After low k etch stop 114 has been etched to pattern the contacts/vias and the photoresist has been removed, a second dielectric layer 118 of silicon oxycarbide is deposited to a thickness of about 5,000 to about 15,000 Å as shown in FIG. 2D. The second dielectric layer 118 may be plasma treated with helium or a reducing gas, such as hydrogen, at a power level of between about 600 watts and about 800 watts for between about 40 seconds and about 60 seconds for a 200 millimeter substrate. The processing chamber is maintained at a pressure of about 20 Torr or less and at a substrate temperature of about 450° C. or less during the reactive clean process. The plasma treatment is believed to reduce the reactivity of the surface of the layer 118 to subsequently deposited materials.

In an alternative embodiment, a nitrogen-free silicon carbide or silicon oxide cap layer between about 100 Å and about 500 Å thick may be deposited on second dielectric layer 118 prior to depositing additional materials, such as photoresist materials. In a further alternative embodiment, a silicon carbide cap layer (not shown) may be deposited from the same precursors are by the same process as the silicon carbide barrier layer 110 on the second dielectric layer 118 prior to depositing additional materials, such as photoresist materials.

Figure 2E:
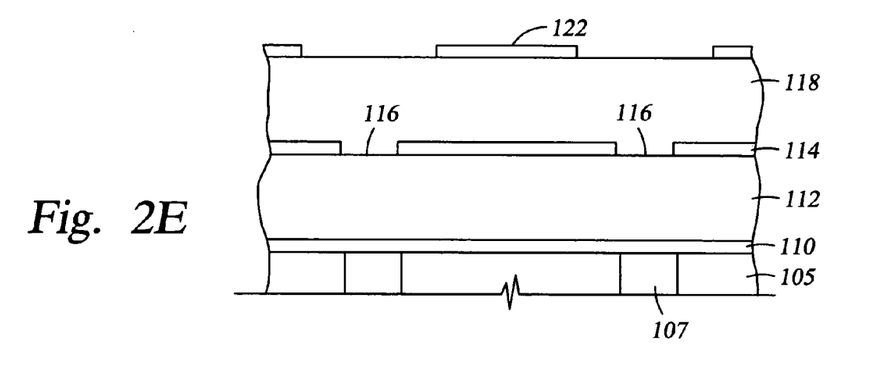
Figure 2F:
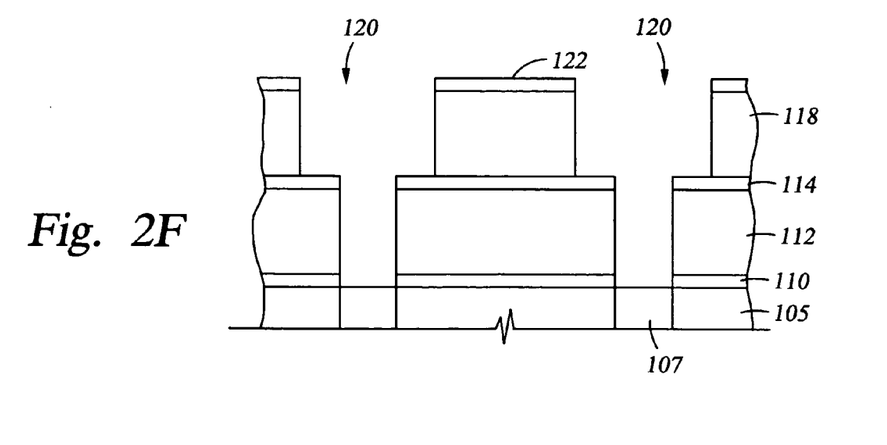

A photoresist material 122 is then deposited on the second dielectric layer 118 (or cap layer) and patterned preferably using conventional photolithography processes to define the interconnect lines 120 as shown in FIG. 2E. The photoresist material 122 comprises a material conventionally known in the art, preferably a high activation energy photoresist, such as UV-5, commercially available from Shipley Company Inc., of Marlborough, Mass. The interconnects and contacts/ vias are then etched using reactive ion etching or other anisotropic etching techniques to define the metallization structure (i.e., the interconnect and contact/via) as shown in FIG. 2F. Any photoresist or other material used to pattern the etch stop 114 or the second dielectric layer 118 is removed using an oxygen strip or other suitable process.

Figure 2G:
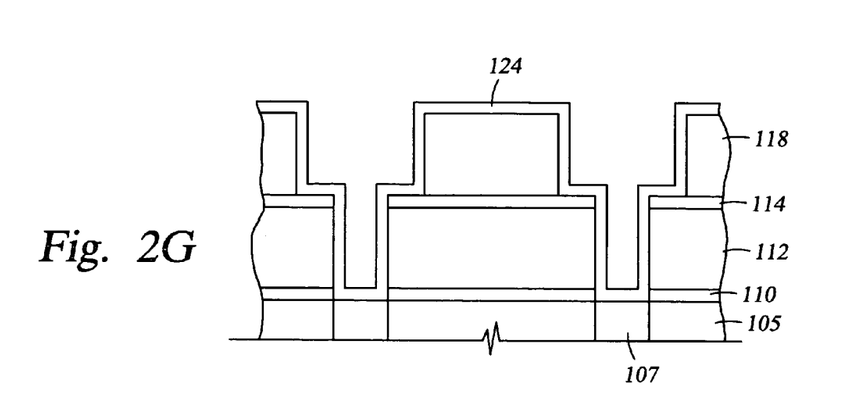
Figure 2H:
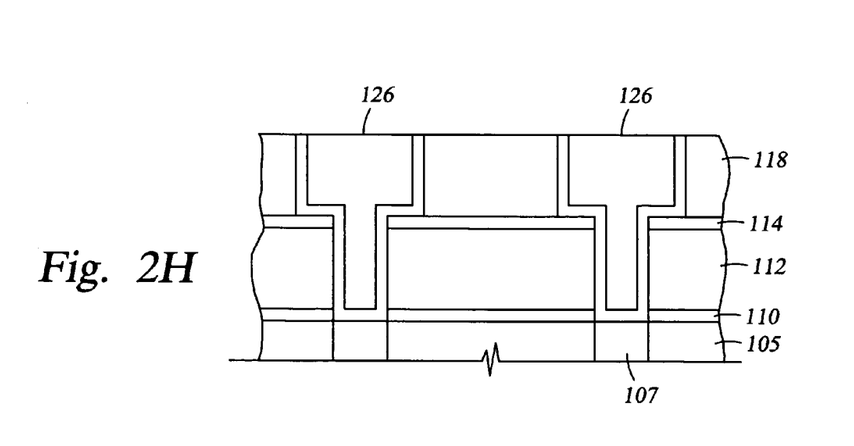

The metallization structure is then formed with a conductive material such as aluminum, copper, tungsten or combinations thereof. Presently, the trend is to use copper to form the smaller features due to the low resistivity of copper (1.7 mW-cm compared to 3.1 mW-cm for aluminum). Preferably, as shown in FIG. 2G, a suitable barrier layer 124 such as tantalum nitride is first deposited conformally in the metallization pattern to prevent copper migration into the surrounding silicon and/or dielectric material. Thereafter, copper 126 is deposited using either chemical vapor deposition, physical vapor deposition, electroplating, or combinations thereof to form the conductive structure. Once the structure has been filled with copper or other metal, the surface is planarized using chemical mechanical polishing, as shown in FIG. 2H.

EXAMPLES

Organosilicon compounds described herein were deposited as barrier layers on substrate surface and analyzed. In one example, a silicon carbide film was deposited from a diphenylsilane compound and compared to a silicon carbide film from a conventional silicon carbide precursor, trimethylsilane.

Both diphenylsilane and trimethylsilane precursors were deposited by introducing diphenylsilane or trimethylsilane at about 500 mg/min into the processing chamber, introducing helium at about 500 sccm into the processing chamber, generating a plasma in the processing chamber by applying 100 watts of RF energy, maintaining the substrate temperature at about 290° C., maintaining the chamber pressure at about 3 Torr to deposit a silicon carbide layer. The heater spacing was about 450 mils from the substrate surface.

The deposited films were examined and analyzed for dielectric constant and barrier layer diffusion. The diphenylsilane silicon carbide film had a measured dielectric constant of about 3.4 and the trimethylsilane silicon carbide film had a measured dielectric constant of about 4.3.

The barrier layer properties were tested by a Bias Temperature test, which was performed by forming a damascene device using the above described silicon carbide films and subjecting the deposited films to a substrate temperature of about 275° C. while measuring leakage current for a device. Leakage current increases with degrading barrier layer properties. When leakage current reaches about $10^{-3}$ amps/cm$^2$, the barrier layer is considered to have failed. When 50% of the devices failed under these processing conditions, the time was measured to indicate barrier effectiveness for the deposited films. Comparison of the films indicated that the diphenylsilane silicon carbide had a leakage current of about $1e^{-09}$ amps/cm$^2$ at 1 mega volts/cm (MV/cm) and about $1e^{-8}$ amps/cm$^2$ at 2 MV/cm and had a 50% failure rate after about 7.9 hours while the trimethylsilane silicon carbide film had a leakage current of about $1e^{-09}$ amps/cm$^2$ at 1 MV/cm and about $1e^{-6}$ amps/cm$^2$ at 2 MV/cm and had a 50% failure rate after about 4.4 hours.

In a further example, diphenylmethylsilane was used to deposit a silicon carbide layer by introducing the diphenylmethylsilane at about 500 mg/min into the processing chamber, introducing helium at about 500 sccm into the processing chamber, generating a plasma in the processing chamber by applying 100 watts of RF energy, maintaining the substrate temperature at about 290° C. for a diphenylsilane deposited film, maintaining the chamber pressure at about 3 Torr to deposit a silicon carbide layer. The heater spacing was about 450 mils from the substrate surface.

The deposited films were examined and analyzed for dielectric constant and barrier layer diffusion. The diphenylmethylsilane silicon carbide film had a measured dielectric constant of about 3.6 compared to about 4.3 for trimethylsilane deposited silicon carbide films. Comparison of the films indicated that the diphenylmethylsilane silicon carbide had a leakage current of about $3e^{-9}$ amps/cm$^2$ at 1 MV/cm and about $4e^{-8}$ amps/cm$^2$ at 2 MV/cm and had a 50% failure rate after about 10 hours while the trimethylsilane silicon carbide film had a leakage current of about $1e^{-09}$ amps/cm$^2$ at 1 MV/cm and about $1e^{-6}$ amps/cm$^2$ at 2 MV/cm and had a 50% failure rate after about 4.4 hours.

In a further example, dimethylphenylsilane was used to deposit a silicon carbide layer by introducing the dimethylphenylsilane at about 500 mg/min into the processing chamber, introducing helium at about 1000 sccm into the processing chamber, generating a plasma in the processing chamber by applying 200 watts of RF energy, maintaining the substrate temperature at about 350° C. for a diphenylsilane deposited film, maintaining the chamber pressure at about 6 Torr to deposit a silicon carbide layer. The heater spacing was about 450 mils from the substrate surface.

The deposited films were examined and analyzed for dielectric constant and barrier layer diffusion. The dimethylphenylsilane silicon carbide film had a measured dielectric constant of about 3.5 compared to about 4.3 for trimethylsilane deposited silicon carbide films. Comparison of the films indicated that the dimethylphenylsilane silicon carbide had a leakage current of about $1e^{-9}$ amps/cm$^2$ at 1 MV/cm and about $2e^{-8}$ amps/cm$^2$ at 2 MV/cm and had a 50% failure rate after about 11 hours while the trimethylsilane silicon carbide film had a leakage current of about $1e^{-09}$ amps/cm$^2$ at 1 MV/cm and about $1e^{-6}$ amps/cm$^2$ at 2 MV/cm and had a 50% failure rate after about 4.4 hours.

This data indicates a significant and unexpected improvement in barrier layer properties and dielectric constant for diphenylsilane or alkyl substituted diphenylsilane compounds in comparison to available barrier layer processes.

While the foregoing is directed to preferred embodiments of the present invention, other and further embodiments of the invention may be devised without departing from the basic scope thereof, and the scope thereof is determined by the claims which follow.

What is claimed is:

1. A method for depositing a silicon carbide layer on a substrate, comprising:

introducing a processing gas comprising an organosilicon compound into a processing chamber containing the substrate therein, wherein the organosilicon compound has the formula $SiH_a(CH_3)_b(C_6B_5)_c$, wherein c is 2 and a+b+c=4; and reacting the organosilicon compound to deposit the silicon carbide layer on the substrate.

2. The method of claim 1, wherein the processing gas further comprises a dopant selected from the group consisting of phosphine ($PH_3$), borane ($BH_3$), diborane ($B_2H_6$), oxygen ($O_2$), ozone ($O_3$), carbon monoxide (CO), carbon dioxide ($C_2$), ammonia ($NH_3$), nitrogen ($N_2$), and combinations thereof.

3. The method of claim 1, wherein the organosilicon compound is selected from the group consisting of diphenylmethylsilane ($SiH_1(CH_3)_1(C_6H_5)_2$), diphenyldimethylsilane ($Si(CH_3)_2(C_6H_5)_2$), diphenyl ($SiH_2(C_6H_5)_2$), and combinations thereof.

4. The method of claim 1, wherein the silicon carbide layer is deposited in a damascene structure as a material layer selected from the group consisting of a silicon carbide-containing barrier layer and a silicon carbide-containing etch stop layer.

5. The method of claim 1, wherein the silicon carbide layer has a dielectric constant of less than 4.

* * * * *

UNITED STATES PATENT AND TRADEMARK OFFICE
CERTIFICATE OF CORRECTION

| | |
|---|---|
| PATENT NO. | : 7,125,813 B2 |
| APPLICATION NO. | : 10/828441 |
| DATED | : October 24, 2006 |
| INVENTOR(S) | : Xia et al. |

It is certified that error appears in the above-identified patent and that said Letters Patent is hereby corrected as shown below:

Column 1, Line 55: Change "-interconnects" to --interconnects--

Column 10, Claim 2, Line 66: Change "$C_2$" to --$CO_2$--

Column 11, Claim 3, Line 4: Change "diphenyl" to --diphenylsilane--

Signed and Sealed this

Twentieth Day of March, 2007

JON W. DUDAS
*Director of the United States Patent and Trademark Office*